(12) United States Patent
Ferme et al.

(10) Patent No.: US 6,428,395 B1
(45) Date of Patent: Aug. 6, 2002

(54) METHOD OF POLISHING AT LEAST ONE SURFACE OF A SILICON-BASED PART

(75) Inventors: Jean-Jacques Ferme, Velaux; Philippe Godefroy, Marseille; Gilbert Dahan, Aix-en-Provence, all of (FR)

(73) Assignee: Societe Europeene de Systemes Optiques, Aix-en-Provence (FR)

( * ) Notice: Subject to any disclaimer, the term of this patent is extended or adjusted under 35 U.S.C. 154(b) by 0 days.

(21) Appl. No.: 09/598,904

(22) Filed: Jun. 22, 2000

(30) Foreign Application Priority Data

Jun. 28, 1999 (FR) .............................. 99 08228

(51) Int. Cl.[7] .................................. B24B 1/00
(52) U.S. Cl. ........................... 451/41; 451/57
(58) Field of Search ............... 451/41, 57, 59, 451/63, 65, 262, 283

(56) References Cited

U.S. PATENT DOCUMENTS 4,867,803 A  9/1989  Shikata et al.
5,704,987 A  1/1998  Huynh et al.
5,775,980 A  7/1998  Sasaki et al.

FOREIGN PATENT DOCUMENTS

EP  0692318  1/1996

*Primary Examiner*—Timothy V. Eley
*Assistant Examiner*—Dung Van Nguyen
(74) *Attorney, Agent, or Firm*—Clark & Brody

(57) ABSTRACT

A method of polishing at least one surface of a silicon-based part made of $SiO_2$, of SiC, of glass, of vitro-ceramic, or of quartz, the method comprising:
  a) a pre-polishing stage implementing at least one pre-polishing element and an abrasive, to confer a first roughness to said surface;
  b) a polishing stage implementing at least one polishing element and a liquid containing a polishing abrasive to confer to said surface a second roughness that is smaller than the first roughness;
the method comprising:
  c) a finishing stage by soft abrasion implementing at least one finishing element, in particular a felt, and a soft abrasive, to remove a surface layer of sufficient thickness to improve the flux strength of the part.

9 Claims, No Drawings

METHOD OF POLISHING AT LEAST ONE SURFACE OF A SILICON-BASED PART

The present invention relates to a method of polishing at least one surface of a silicon-based part made of silica, SiC, glass, quartz, or indeed a vitro-ceramic.

BACKGROUND OF THE INVENTION

Polishing methods are already known which implement a pre-polishing stage by means of at least one polishing element, e.g. a cast iron plate, and an abrasive, e.g. emery, so as to confer a "coarse" first roughness to the surface, followed by a stage of polishing proper that implements at least one polishing element, e.g. a polyurethane support or pitch, and a liquid containing an abrasive, and in particular an abrasive oxide, e.g. an oxide of cerium or of zirconium, to confer a second roughness to said surface that is smaller, i.e. finer, than said first roughness.

Such methods enable highly polished surfaces to be obtained in which the second roughness is smaller than 10 Å, and is of the order of a few Å.

Nevertheless, the Applicant has observed that in spite of that high quality surface state, parts made using those known methods present flux strength that is not satisfactory.

Flux strength represents the quantity of energy that a surface can receive without shattering. It can be measured by means of a pulsed laser that emits pulses of given wavelength and duration. It is then expressed in $J/cm^2$. It is expressed in $W/cm^2$ for continuous lasers.

The present invention is based on the idea that the unsatisfactory flux strength of such a silicon-based part which has been polished by known methods is due in particular to the surface being contaminated by residues of exogenous abrasive (e.g. cerium oxide or zirconium oxide) remaining after polishing. In addition, the surfaces obtained by known methods are also liable to present microcracks which also decrease flux strength.

OBJECTS AND SUMMARY OF THE INVENTION

An object of the invention is to improve the flux strength of the surface of such a silicon-based part, and to this end, the invention present, after pre-polishing and polishing stages, a finishing stage by soft abrasion implementing at least one finishing element, in particular a felt, and a soft abrasive constituted in particular by colloidal silica, so as to remove a surface layer of sufficient thickness to improve the flux strength of said part.

During this step, roughness is not necessarily improved, in particular for parts where an improvement in flux strength is specifically desired, e.g. silica parts for power lasers. Nevertheless, it should be observed that the method of the invention makes it possible, if necessary, to obtain improved roughness that can be of the order of 1 Å.

When the part is a plane part, the method is preferably implemented by polishing two opposite parallel plane faces of said plane part simultaneously, even if a high quality surface state is required for only one of the faces of the part.

DETAILED DESCRIPTION OF THE INVENTION

The description below enables the invention to be understood better by explaining it with the help of examples that are given in non-limiting manner.

The pre-polishing stage, the polishing stage, and the finishing stage are performed on three successive stations. For machining two plane faces simultaneously, it is possible, for example, to use the double-face machines sold by Strasbaugh of 825 Buchly Road, San Luis Obispo, Calif. 94301 (USA), or by PR Hoffman Machine Products of 1517 Commerce Avenue, Carlish, Pa. 17013 (USA).

Pre-polishing of the parts is performed by fitting a double-face machine with cast iron plates and by using emery as the abrasive. The speed of rotation of the top and bottom plates is of the order of 20 revolutions per minute (rpm) to 30 rpm. The part(s) is/are carried by a planet driven in rotation and having its axis off-center relative to the axis of the plates, with the planet rotating at a speed of about 20 rpm. This step makes it possible to remove by abrasion a layer that is about 200 μm to 500 μm thick.

The parts are then polished by fitting a double-face machine with polyurethane plates that rotate at about 20 rpm, and by using cerium oxide or zirconium oxide as the abrasive, the oxide being in an aqueous suspension. The part(s) is/are carried by a planet that is driven in rotation and whose axis is offset from the axis of the plates, the speed of rotation of the planet being about 20 rpm. After 1 hour, this polishing serves to remove a layer of thickness that is about 10 μm to 50 μm and to obtain surfaces having roughness of the order of a few Å. This polishing stage can also be performed using pitch.

In general, the pre-polishing and polishing conditions used in the prior art can be suitable for use in the method of the invention.

The finishing of the parts by soft abrasion can be performed on a double-face machine fitted with two finishing elements, e.g. of felt, rotating at a speed of about 20 rpm to 30 rpm, the abrasive being a colloidal silica containing silica particles of uniform size. This particle size preferably lies in the range 0.03 μm to 0.1 μm. The abrasion pressure applied to the surface by the finishing elements can lie in the range 10 grams per square centimeter ($g/cm^2$) to 100 $g/cm^2$. The part(s) is/are carried by a planet that is rotated and whose axis of rotation is offset relative to the axis of the plate, its speed of rotation being about 20 rpm to 30 rpm. During this finishing, abrasion removes 1 μm to 3 μm of material or even more, with the preferred value being about 3 μm.

Insofar as it is desired specifically to improve flux strength (e.g. $SiO_2$ parts for power lasers), in particular in the context of the Megajoule program of the (French) Commissariat á l 'Energie Atomique (CEA) or the National Ignition Facility (NIF) of the Lawrence Livermore National Laboratory (LLNL)), there is no need to improve roughness compared with the value obtained after the polishing stage (second roughness of the order of a few Å, e.g. 3 Å to 5 Å).

The method of the invention thus makes it possible to obtain polished $SiO_2$ surfaces having a flux strength of at least 20 $J/cm^2$ when faced with pulses delivered by a triple YAG laser operating at 0.355 μm with a pulse duration of 40 ns, which is to be compared with values lying in the range 13 $J/cm^2$ to 15 $J/cm^2$ obtained with conventional methods.

Another experiment performed with an excimer laser delivering pulses at 0.10 μm with a pulse duration of 15 ns and using a surface prepared in accordance with the invention has made it possible to obtain flux strength of not less than 13 $J/cm^2$ as compared with 4 $J/cm^2$ with a conventional method.

Nevertheless, in particular by selecting fine-grain silica (e.g. 0.03 μm) the method makes it possible to obtain surfaces of very small roughness (e.g. about 1 Å) The method is also suitable for making parts of large dimensions, e.g. several hundreds of mm, and in particular circular parts having a diameter of several hundreds of mm.

When making plane parts, it is advantageous to implement the method by using double-face polishing machines even if polishing is required on one face only, since the result is obtained more quickly by using this technique.

In addition, polishing makes it possible to obtain two opposite surfaces which present a very high degree of parallelism, a very high degree of planeness, and very good roughness, as well as improved flux strength.

What is claimed is:

1. A method of polishing at least one surface of a silicon-based part made of $SiO_2$, of SiC, of glass, of vitroceramic, or of quartz, the method comprising:
   a) a coarse-polishing stage implementing at least one coarse-polishing element and an abrasive to remove a first surface layer having a first thickness and to confer a first roughness to said surface;
   b) a polishing stage implementing at least one polishing element and a liquid containing a polishing abrasive to remove a second surface layer having a second thickness smaller than the first thickness and to confer to said surface a second roughness that is smaller than the first roughness; and
   c) a finishing stage by soft abrasion implementing at least one finishing element and a soft abrasive, to remove a third surface layer having a third thickness sufficient thickness to improve a flux strength of the part, the third thickness being smaller than the second thickness.

2. A method according to claim 1, wherein the coarse-polishing element is a cast iron plate and wherein the abrasive is emery.

3. A method according to claim 1, wherein the polishing element is a polyurethane plate or pitch and wherein the polishing abrasive is an oxide.

4. A method according to claim 3, wherein the polishing abrasive is one of cerium or zirconium.

5. A method according to claim 1, wherein the soft abrasive is constituted by colloidal silica.

6. A method according to claim 5, wherein the colloidal silica has particles of a size lying in the range 0.03 $\mu$m to 0.1 $\mu$m.

7. A method according to claim 1, wherein the silicon based part is a plane part and wherein the coarse-polishing, polishing and finishing stages are implemented on two opposite parallel plane faces of said plane part.

8. A method according to claim 1, wherein the finishing stage is performed in such a manner as to confer to said surface a third roughness that is smaller than said second roughness.

9. A method according to claim 1, wherein the at least one finishing element is a felt.

* * * * *